United States Patent
Yoo

(10) Patent No.: US 10,057,690 B2
(45) Date of Patent: Aug. 21, 2018

(54) DETACHABLE MICROPHONE AND METHOD OF MANUFACTURING THE SAME

(71) Applicant: Hyundai Motor Company, Seoul (KR)

(72) Inventor: Ilseon Yoo, Seoul (KR)

(73) Assignee: Hyundai Motor Company, Seoul (KR)

( * ) Notice: Subject to any disclaimer, the term of this patent is extended or adjusted under 35 U.S.C. 154(b) by 232 days.

(21) Appl. No.: 14/955,341

(22) Filed: Dec. 1, 2015

(65) Prior Publication Data

US 2017/0064459 A1 Mar. 2, 2017

(30) Foreign Application Priority Data

Aug. 28, 2015 (KR) ........................ 10-2015-0121848

(51) Int. Cl.
| | |
|---|---|
| *H04R 17/02* | (2006.01) |
| *H04R 19/04* | (2006.01) |
| *H04R 17/00* | (2006.01) |
| *H04R 31/00* | (2006.01) |
| *H04R 1/02* | (2006.01) |

(52) U.S. Cl.
CPC ........... *H04R 19/04* (2013.01); *H04R 17/005* (2013.01); *H04R 17/02* (2013.01); *H04R 31/00* (2013.01); *H04R 31/006* (2013.01); *B81B 2201/0257* (2013.01); *H04R 1/025* (2013.01); *H04R 2201/003* (2013.01); *H04R 2499/13* (2013.01)

(58) Field of Classification Search
CPC ........ H04R 1/04; H04R 17/005; H04R 17/02; H04R 17/025; H04R 19/005; H04R 19/016; H04R 19/04; H04R 31/006; H04R 2201/003; H04R 2499/11; B81B 2201/0257

USPC ....... 381/113, 114, 355, 356, 369, 173, 174, 381/175, 190, 191; 29/25.35, 25.41, 29/25.42, 594; 257/416, 417; 438/53; 310/322

See application file for complete search history.

(56) References Cited

U.S. PATENT DOCUMENTS

| | | | | |
|---|---|---|---|---|
| 3,894,198 | A * | 7/1975 | Murayama | ........... H04R 17/005 |
| | | | | 310/322 |
| 6,967,362 | B2 * | 11/2005 | Nam | ................... B81C 1/00182 |
| | | | | 257/254 |
| 2013/0051586 | A1 * | 2/2013 | Stephanou | ............... H04R 1/04 |
| | | | | 381/173 |
| 2013/0294617 | A1 | 11/2013 | Alberth, Jr. | |
| 2014/0184028 | A1 | 7/2014 | Hsu et al. | |

FOREIGN PATENT DOCUMENTS

| | | |
|---|---|---|
| JP | 2002-095092 A | 3/2002 |
| JP | 2007-013509 A | 1/2007 |
| KR | 10-0724100 | 6/2007 |
| KR | 10-0889032 B1 | 3/2009 |

* cited by examiner

*Primary Examiner* — Huyen D Le
(74) *Attorney, Agent, or Firm* — Mintz Levin Cohn Ferris Glovsky and Popeo, P.C.; Peter F. Corless

(57) ABSTRACT

A detachable microphone includes: a body part made of a flexible polymer; a capacitance part positioned in the body part and including a support interposed between a first capacitive electrode and a second capacitive electrode; and a piezoelectric part positioned on the capacitance part and positioned in the body part, and including a piezoelectric body interposed between a first piezoelectric electrode and a second piezoelectric electrode.

6 Claims, 18 Drawing Sheets

DETACHABLE MICROPHONE AND METHOD OF MANUFACTURING THE SAME

CROSS-REFERENCE TO RELATED APPLICATION

This application claims under 35 U.S.C. § 119(a) the benefit of Korean Patent Application No. 10-2015-0121848 filed in the Korean Intellectual Property Office on Aug. 28, 2015, the entire contents of which are incorporated herein by reference.

BACKGROUND (a) Technical Field

The present invention relates to a detachable microphone and a method of manufacturing the same, more particularly, to a detachable microphone capable of improving sensitivity by including a piezoelectric part and a capacitance part, and a method of manufacturing the same.

(b) Description of the Related Art

As a result of market demand for intelligent vehicles, research and development has increased of various technologies in order to provide safety and convenience for vehicle occupants.

For example, voice recognition systems may be provided in vehicles for decreasing unnecessary actions of a driver while driving.

However, voice recognition systems according to the related art generally have a low voice recognition rate, thus limiting their usefulness to drivers.

In order to overcome the problem as described above, improvement in performance of a microphone, improvement of a voice recognition algorithm, control of noise within a vehicle, and the like, have been suggested as possible solutions, and research and development of these technologies have been required.

The above information disclosed in this background section is only for enhancement of understanding of the background of the invention and therefore it may contain information that does not form the prior art that is already known in this country to a person of ordinary skill in the art.

SUMMARY

The present invention provides a detachable microphone and a method of manufacturing the same having advantages of improving sensitivity by including a piezoelectric part and a capacitance part and outputting a voltage from each of the piezoelectric part and the capacitance part when sound pressure is input.

An exemplary embodiment of the present invention provides a detachable microphone including: a body part made of a flexible polymer; a capacitance part positioned in the body part and including a support interposed between a first capacitive electrode and a second capacitive electrode; and a piezoelectric part positioned on the capacitance part and positioned in the body part, and including a piezoelectric body interposed between a first piezoelectric electrode and a second piezoelectric electrode.

The support may be positioned on the second capacitive electrode, include a first support and a second support spaced apart from each other by a predetermined gap, and have a space part formed between the first support and the second support.

The piezoelectric part may vibrate together with the first capacitive electrode when sound pressure is input.

In the capacitance part, the first capacitive electrode may vibrate together with the piezoelectric part when sound pressure is input, such that a gap between the first capacitive electrode and the second capacitive electrode is changed.

The piezoelectric body may be made of any one of polyvinyl difluoride (PVDF), lead zirconate titanate (PZT), zinc peroxide (ZnO), and barium titanate ($BaTiO_3$).

The support may be made of SU-8.

The flexible polymer may be made of polydimethylsiloxane (PDMS).

Another exemplary embodiment of the present invention provides a method of manufacturing a detachable microphone, including the steps of: forming a first capacitance electrode part including a first body part, a second body part, and a first capacitive electrode; forming a piezoelectric part on the first capacitance electrode part, the piezoelectric part including a third body part, a first piezoelectric electrode, a second piezoelectric electrode, and a piezoelectric body; forming a support in the second body part; forming a second capacitance electrode part below the first capacitance electrode part, the second capacitance electrode part including a fourth body part and a second capacitive electrode; and bonding the first capacitance electrode part and the second capacitance electrode part to each other.

The forming of the first capacitance electrode part may include: patterning the first capacitive electrode on a first substrate; forming the first body part so as to cover the first substrate and the first capacitive electrode; separating the first capacitive electrode and the first body part from the first substrate; and performing $O_2$ plasma treatment on a surface on which the first capacitive electrode is exposed to form a first bonded part on the first body part.

The forming of the first capacitance electrode part may further include: patterning an auxiliary support on a second substrate; forming the second body part so as to cover the second substrate and the auxiliary support; performing $O_2$ plasma treatment on an upper surface of the second body part to form a second bonded part on the second body part; and bonding the first bonded part and the second bonded part to each other.

The forming of the piezoelectric part may include: sequentially patterning the first piezoelectric electrode, the piezoelectric body, and the second piezoelectric electrode on the first body part; and forming a third body part so as to cover the first piezoelectric electrode, the piezoelectric body, and the second piezoelectric electrode.

The forming of the piezoelectric part may further include: separating the second body part from the second substrate and the auxiliary support; and performing $O_2$ plasma treatment on a surface on which the second body part is exposed to form a third bonded part on the second body part.

The forming of the support may include: coating a sacrificial layer on a third substrate; patterning a first support and a second support on the sacrificial layer so as to be spaced apart from each other by a predetermined gap; forming an adhering part on the sacrificial layer, the first support, and the second support; bonding the adhering part and the third bonded part to each other; removing the sacrificial layer to separate the second body part from the third substrate; and performing $O_2$ plasma treatment on a surface on which the second body part, the first support, and the second support are exposed to form a fourth bonded part on the second body part.

The forming of the adhering part may be performed through silanization.

The forming of the second capacitance electrode part may include: patterning the second capacitive electrode on a fourth substrate; forming the fourth body part so as to cover the fourth substrate and the second capacitive electrode; separating the second capacitive electrode and the fourth body part from the fourth substrate; and performing $O_2$ plasma treatment on a surface on which the second capacitive electrode is exposed to form a fifth bonded part on the fourth body part.

The bonding of the first capacitance electrode part and the second capacitance electrode part to each other may include bonding the fourth bonded part and the fifth bonded part to each other.

The piezoelectric body may be made of any one of polyvinyl difluoride (PVDF), lead zirconate titanate (PZT), zinc peroxide (ZnO), and barium titanate ($BaTiO_3$).

The support may be made of SU-8.

The first to fourth parts may be made of polydimethylsiloxane (PDMS), which is a flexible polymer.

The detachable microphone according to an exemplary embodiment of the present invention is made of a biocompatible flexible polymer, such that it is easily attached and detached, thereby making it possible to improve efficiency.

The detachable microphone according to an exemplary embodiment of the present invention includes the piezoelectric part and the capacitance part, and when the sound pressure is input from the outside, the piezoelectric part vibrates such that voltages are output from each of the piezoelectric part and the capacitance part, thereby making it possible to improve sensitivity.

Other effects that may be obtained or predicted by an exemplary embodiment of the present invention will be disclosed explicitly or implicitly in a detailed description for an exemplary embodiment of the present invention. That is, various effects predicted according to an exemplary embodiment of the present invention will be disclosed in a detailed description to be provided below.

DETAILED DESCRIPTION OF THE EMBODIMENTS

Hereinafter, an exemplary embodiment of the present invention will be described with reference to the accompanying drawings. However, the accompanying drawings and detailed description to be described below relate to one of several exemplary embodiments for effectively describing a feature of the present invention. Therefore, the present invention is not limited to only the accompanying drawings.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present invention may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Figure 1:
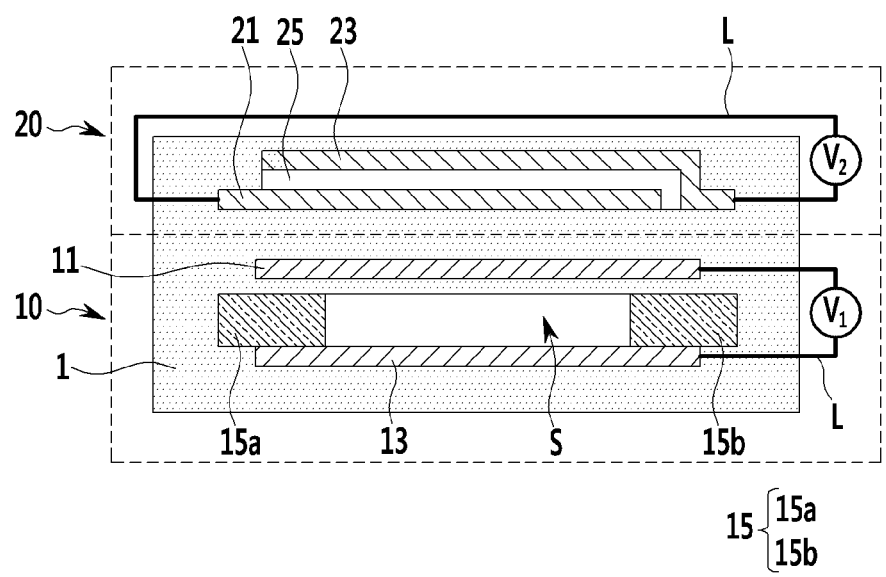
FIG. 1 is a schematic view of a detachable microphone according to an exemplary embodiment of the present invention.

FIG. 1 is a schematic view of a detachable microphone according to an exemplary embodiment of the present invention.

Referring to FIG. 1, the detachable microphone according to an exemplary embodiment of the present invention is attached to a portion of a body of a driver of a vehicle.

For example, the detachable microphone may be attached to the neck of the driver of the vehicle.

The detachable microphone is operated by recognizing a sound source including the voice of the driver of the vehicle.

That is, when a sound source is input from the outside, the detachable microphone generates a voltage while being vibrated, and outputs the generated voltage to a signal processing circuit (not shown).

To this end, the detachable microphone according to an exemplary embodiment of the present invention is configured to include a body part 1, a capacitance part 10, and a piezoelectric part 20.

First, the body part 1 is made of a flexible polymer that is easily attached to and detached from the human body, and encloses the capacitance part 10 and the piezoelectric part 20.

Here, the flexible polymer may include polydimethylsiloxane (PDMS), which is a material that is harmless to the human body.

In addition, the capacitance part 10 is positioned in the body part 1 and includes a first capacitive electrode 11, a second capacitive electrode 13, and a support 15.

The first capacitive electrode 11 is positioned above the second capacitive electrode 13.

In addition, the first capacitive electrode 11 and the second capacitive electrode 13 are made of a conductive material, but are not limited thereto. That is, the first capacitive electrode 11 and second capacitive electrode 13 may be made of a transparent conductive material such as ITO or the like.

The first capacitive electrode 11 and the second capacitive electrode 13 are connected to an external signal processing circuit through wiring L to which the respective sides thereof are connected.

In addition, the support 15 is disposed between the first capacitive electrode 11 and the second capacitive electrode 13.

A transverse cross-sectional surface of the support 15 may have a circular shape, an oval shape, or a polygonal shape including a quadrangular shape.

The support 15 includes a first support 15a and a second support 15b spaced apart from each other by a predetermined gap.

That is, the supports 15 are positioned on the second capacitive electrode 13, and may be formed at both sides of the second capacitive electrode 13 in a state in which they are spaced apart from each other by a predetermined gap.

In addition, a space part S is formed between the first support 15a and the second support 15b.

In other words, the support 15 is formed in a circular pattern, an oval pattern, or a polygonal pattern including a quadrangular pattern to form the space part S therein.

In addition, the support 15 preferably is made of a rigid polymer. The rigid polymer may include SU-8.

In the capacitance part 10, as described above, the second capacitive electrode 13 is fixed by the support 15, and the first capacitive electrode 11 vibrates when sound pressure is input from the outside.

Therefore, as a gap of the space part S formed by the support 15 is changed, a capacitance of the capacitance part 10 is changed, such that a voltage V1 is generated.

The capacitance part 10 outputs the voltage V1 to the signal processing circuit through the wiring L connected to the first capacitive electrode 11 and the second capacitive electrode 13.

Meanwhile, the piezoelectric part 20 is positioned on the capacitance part 10 and positioned in the body part 1, and includes a first piezoelectric electrode 21, a second piezoelectric electrode 23, and a piezoelectric body 25.

The first piezoelectric electrode 21 and the second piezoelectric electrode 23 are disposed with the piezoelectric body 25 interposed therebetween.

That is, the second piezoelectric electrode 23 is positioned above the first piezoelectric electrode 21.

The first piezoelectric electrode 21 and the second piezoelectric electrode 23 are made of a conductive material, similar to the first capacitive electrode 11 and the second capacitive electrode 13, but are not limited thereto.

In addition, the first piezoelectric electrode 21 and the second piezoelectric electrode 23 may be made of a material that is the same as or different from that of the first capacitive electrode 11 and the second capacitive electrode 13.

In addition, the piezoelectric body 25 is interposed between the first piezoelectric electrode 21 and the second piezoelectric electrode 23.

That is, the piezoelectric body 25 is positioned on the first piezoelectric electrode 21 and is enclosed by the first piezoelectric electrode 21 and the second piezoelectric electrode 23, and front ends of both sides of the piezoelectric body 25 contact the body part 1.

The piezoelectric body 25 preferably is made a conductive material.

For example, the conductive material may include any one of polyvinyl difluoride (PVDF), lead zirconate titanate (PZT), zinc peroxide (ZnO), and barium titanate ($BaTiO_3$).

In addition, the first piezoelectric electrode 21 and the second piezoelectric electrode 23 are connected to an external signal processing circuit through wiring L to which the respective one sides thereof are connected.

The piezoelectric part 20 as described above generates a voltage V2 using a piezoelectric phenomenon generated in the piezoelectric body 25 when the sound pressure is input from the outside.

Here, the piezoelectric phenomenon is a phenomenon that positive electric charges and negative electric charges that are in proportion to each other appear on both surfaces of a predetermined crystal plate by applying pressure to the predetermined crystal plate in a predetermined direction.

Therefore, the detachable microphone according to an exemplary embodiment of the present invention configured as described above includes the body part 1 that is detachable, and the capacitance part 10 and the piezoelectric part 20 disposed in the body part 1, and in the case in which the sound pressure is input from the outside, the piezoelectric part 20 and the first capacitive electrode 11 vibrate.

Therefore, in the capacitance part 10, as the first capacitive electrode 11 vibrates, a gap between the first capacitive electrode 11 and the second capacitive electrode 13 is changed to generate a change in capacitance such that the voltage V1 is generated, and in the piezoelectric part 20, the voltage V2 is generated due to a piezoelectric effect by deformation of the piezoelectric body 25.

That is, the detachable microphone maximizes sensitivity by simultaneously generating the voltages V1 and V2 in the capacitance part 10 and the piezoelectric part 20 by the sound pressure input from the outside, and may be easily detached from and attached to the human body by the body part 1 made of the flexible material.

In addition, in the detachable microphone, the support 15 is made of the rigid polymer, thereby making it possible to prevent generation of an unnecessary signal due to movement of the driver generated while driving.

FIGS. 2 to 18 are views showing steps in a process of manufacturing a detachable microphone according to an exemplary embodiment of the present invention.

Figure 2:
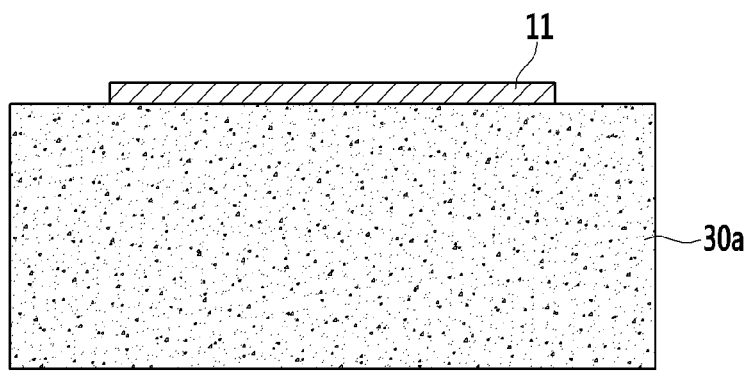
FIGS. 2 to 18 are views showing steps in a process of manufacturing a detachable microphone according to an exemplary embodiment of the present invention.

Referring to FIG. 2, the first capacitive electrode 11 is patterned on a first substrate 30a.

In more detail, after a conductive material is coated on the first substrate 30a, patterning is performed using a mask to form the first capacitive electrode 11.

Here, the first substrate 30a may be a substrate made of a silicon material.

Figure 3:
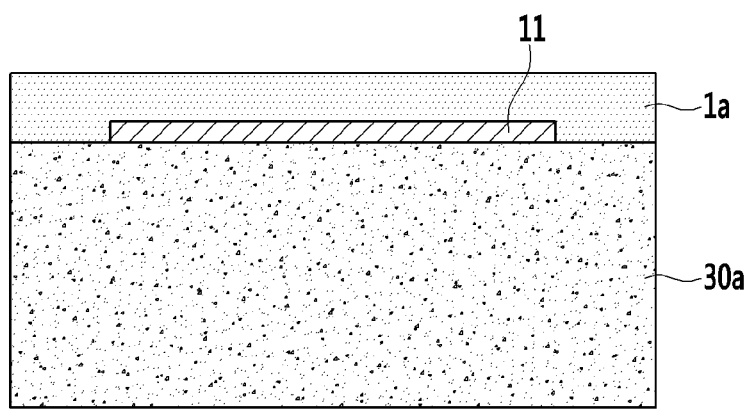

Referring to FIG. 3, a first body part 1a is formed to cover the first substrate 30a and the first capacitive electrode 11.

Here, the first body part 1a is made of a flexible polymer, and the flexible polymer may include poly dimethyl siloxane (PDMS), which is a material that is harmless to the human body.

Figure 4:
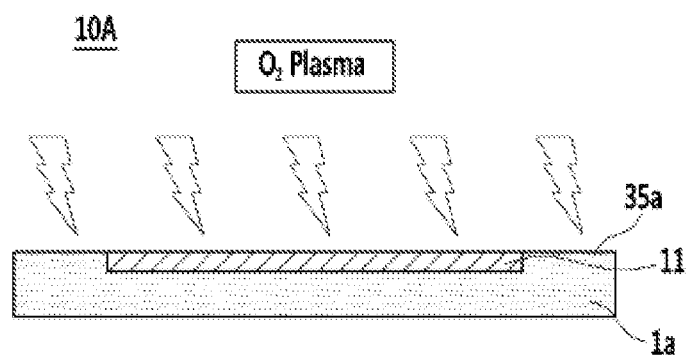

Referring to FIG. 4, the first capacitive electrode 11 and the first body part 1a are separated from the first substrate 30a to form a first capacitance electrode part 10A.

Here, when the first capacitive electrode 11 and the first body part 1a are separated from the first substrate 30a, a peel-off scheme is used. The reason is that the first body part 1a may be easily separated from the first substrate 30a that is firm since it is a flexible material.

Then, $O_2$ plasma treatment is performed on a surface on which the first capacitive electrode 11 is exposed to form a first bonded part 35a on the first body part 1a.

Here, since the first body part 1a is made of the flexible polymer, when the $O_2$ plasma treatment is performed on the flexible polymer, viscosity of a surface of the flexible polymer is changed such that the first bonded part 35a serves as an adhesive.

Figure 5:
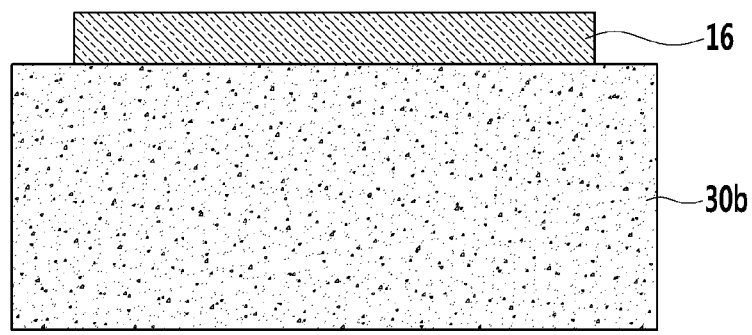

Referring to FIG. 5, an auxiliary support 16 is patterned on a second substrate 30b.

The second substrate 30b may be a substrate made of a silicon material.

In addition, the auxiliary support 16 is made of a rigid polymer. The rigid polymer may include SU-8.

In other words, the auxiliary support 16 may be formed by coating the rigid polymer on the second substrate 30b and then patterning the rigid polymer using a mask.

Figure 6:
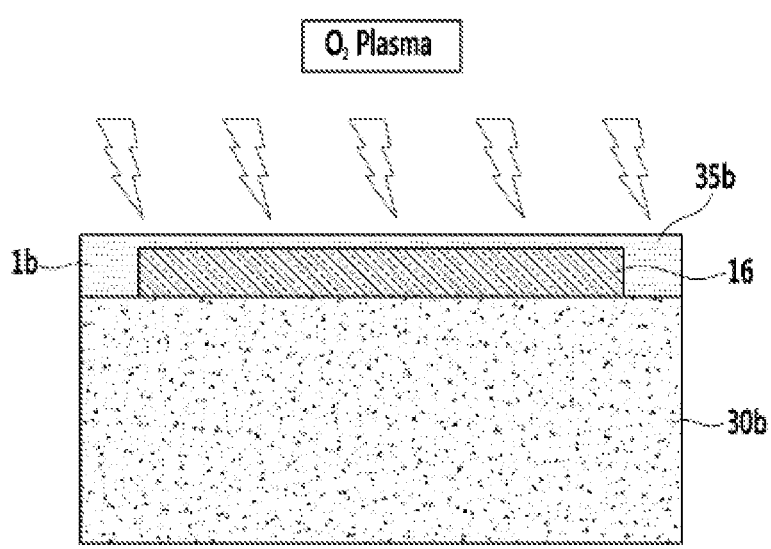

Referring to FIG. 6, a second body part 1b is formed to cover the second substrate 30b and the auxiliary support 16.

Then, $O_2$ plasma treatment is performed on an upper surface of the second body part 1b to form a second bonded part 35b on the second body part 1b.

The second body part 1b is made of a flexible polymer, and the flexible polymer may include polydimethylsiloxane (PDMS), which is a material that is harmless to the human body.

Figure 7:
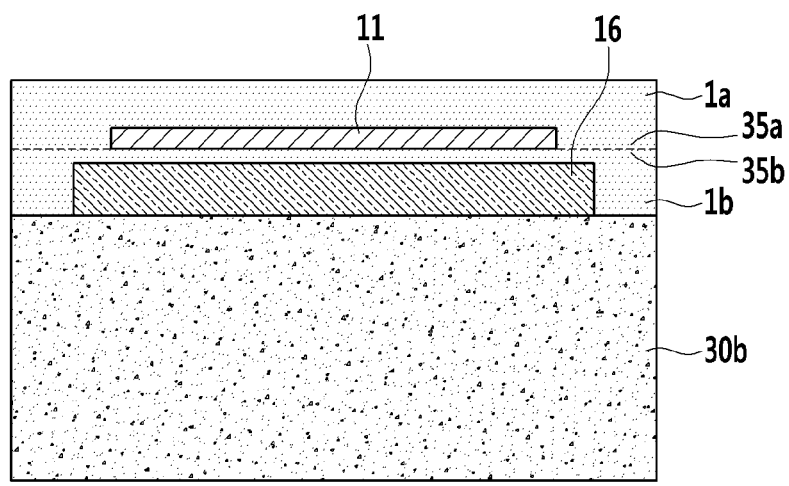

Referring to FIG. 7, the first bonded part 35a of the first body part 1a and the second bonded part 35b of the second body part 1b are bonded to each other.

Figure 8:
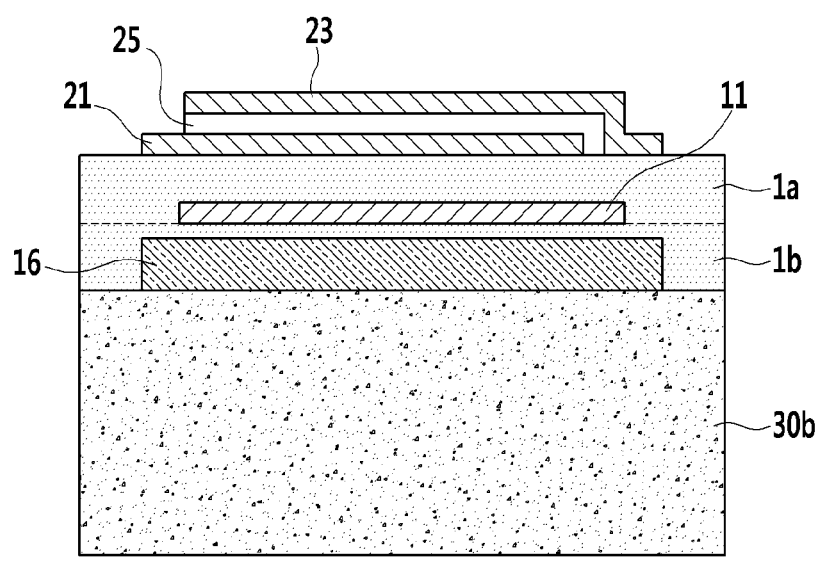

Referring to FIG. 8, the first piezoelectric electrode 21, the piezoelectric body 25, and the second piezoelectric electrode 23 are sequentially patterned on the first body part 1a.

In other words, the first piezoelectric electrode 21 is patterned on an upper surface of the first body part 1a.

Then, the piezoelectric body 25 is patterned to partially contact the first body part 1a and the first piezoelectric electrode 21.

Finally, the second piezoelectric electrode 23 is patterned to partially contact the first body part 1a and the piezoelectric body 25.

Here, the first piezoelectric electrode 21 and the second piezoelectric electrode 23 may be made of a conductive material, but are not limited thereto.

In addition, the piezoelectric body 25 is made of a conductive material, which may include any one of polyvinyl difluoride (PVDF), lead zirconate titanate (PZT), zinc peroxide (ZnO), and barium titanate (BaTiO$_3$).

Figure 9:
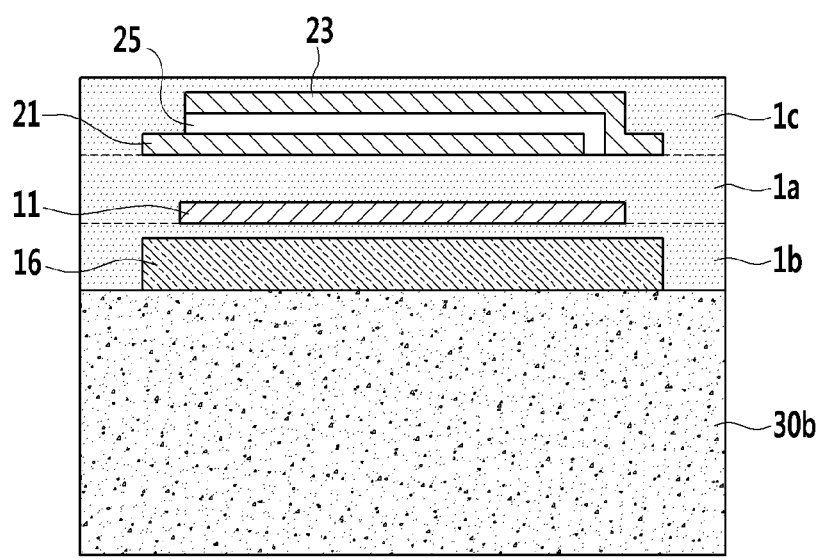

Referring to FIG. 9, a third body part 1c is formed to cover the first piezoelectric electrode 21, the piezoelectric body 25, and the second piezoelectric electrode 23.

The third body part 1c preferably is made of a flexible polymer, and the flexible polymer may include polydimethylsiloxane (PDMS), which is a material that is harmless to the human body.

Figure 10:
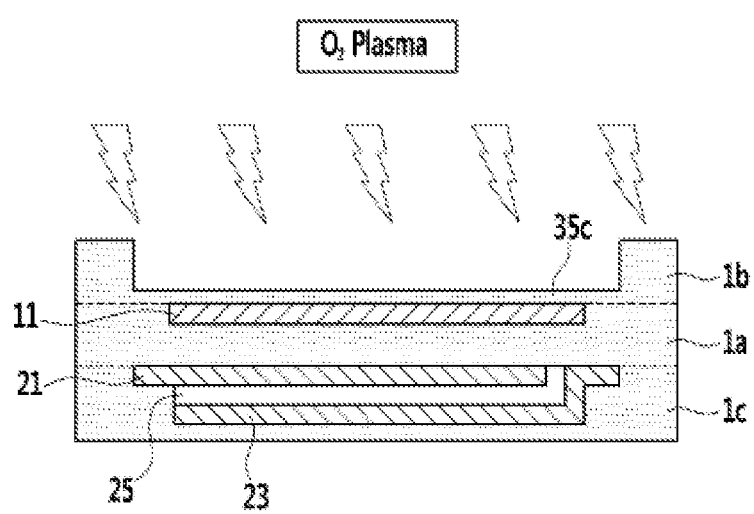

Referring to FIG. 10, the second body part 1b is separated from the second substrate 30b and the auxiliary support 16.

In other words, the second body part 1b is separated from the second substrate 30b and the auxiliary support 16 such that the first to third body parts 1a, 1b, and 1c, the first capacitive electrode 11, the first piezoelectric electrode 21, the second piezoelectric electrode 23, and the piezoelectric body 25 are separated from the second substrate 30b and the auxiliary support 16.

Then, $O_2$ plasma treatment is performed on a surface on which the second body part 1b is exposed to form a third bonded part 35c on the second body part 1b.

Figure 11:
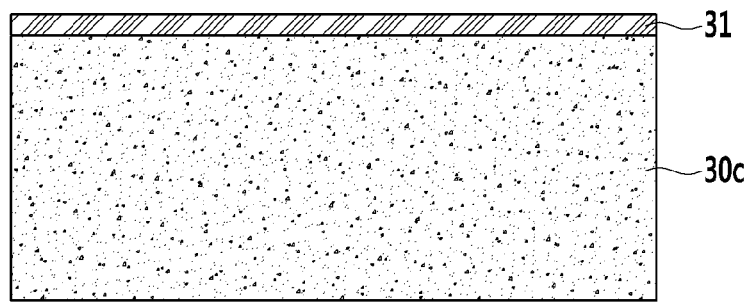

Referring to FIG. 11, a sacrificial layer 31 is coated on a third substrate 30c.

The third substrate 30c may be a substrate made of a silicon material.

In addition, the sacrificial layer 31 is a layer that is removed in a subsequent process, and may be an oxide layer.

Figure 12:
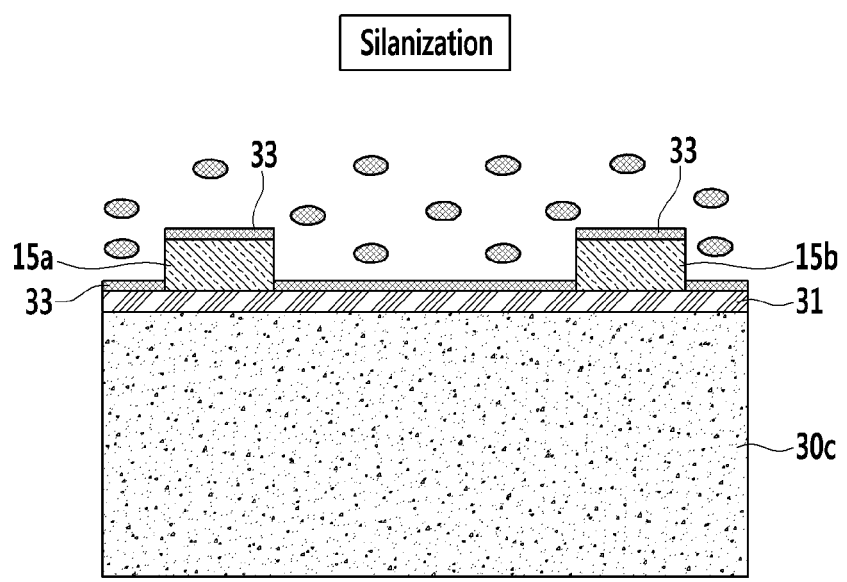

Referring to FIG. 12, the support 15 is patterned on the sacrificial layer 31.

A transverse cross-sectional surface of the support 15 may have a circular shape, an oval shape, or a polygonal shape including a quadrangular shape.

The support 15 includes the first support 15a and the second support 15b spaced apart from each other by a predetermined gap.

The space part S is formed between the first support 15a and the second support 15b.

The support 15 is formed in a circular pattern, an oval pattern, or a polygonal pattern including a quadrangular pattern to form the space part S therein.

Then, an adhering part 33 is formed on the sacrificial layer 31, the first support 15a, and the second support 15b.

The adhering part 33 may be formed through silanization.

Figure 13:
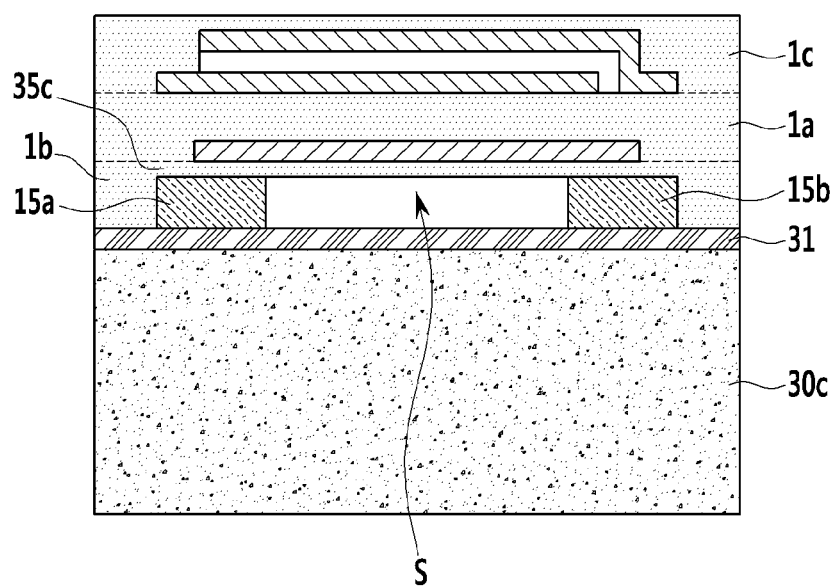

Referring to FIG. 13, the adhering part 33 formed on the sacrificial layer 31, and the first and second supports 15a and 15b and the third bonded part 35c formed on the second body part 1b are bonded to each other.

Here, since the adhering part 33 has a thin thickness, it may be visible.

Figure 14:
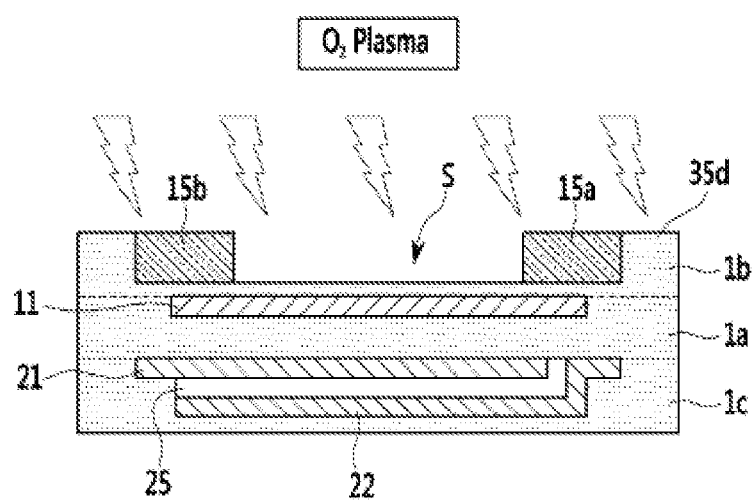

Referring to FIG. 14, the sacrificial layer 31 is removed to separate the second body part 1b from the third substrate 30c.

In other words, the second body part 1b is separated from the third substrate 30c such that the first to third body parts 1a, 1b, and 1c, the first capacitive electrode 11, the first piezoelectric electrode 21, the second piezoelectric electrode 23, the piezoelectric body 25, and the first and second supports 15a and 15b are separated from the third substrate 30c.

Then, $O_2$ plasma treatment is performed on a surface on which the first and second supports 15a and 15b are exposed to form a fourth bonded part 35d on the second body part 1b.

Figure 15:
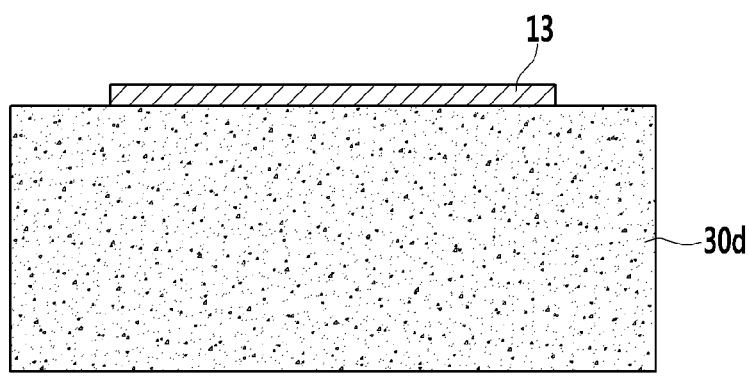

Referring to FIG. 15, the second capacitive electrode 13 is patterned on a fourth substrate 30d.

In more detail, after a conductive material is coated on the fourth substrate 30d, patterning is performed using a mask to form the second capacitive electrode 13.

The fourth substrate 30d may be a substrate made of a silicon material.

Figure 16:
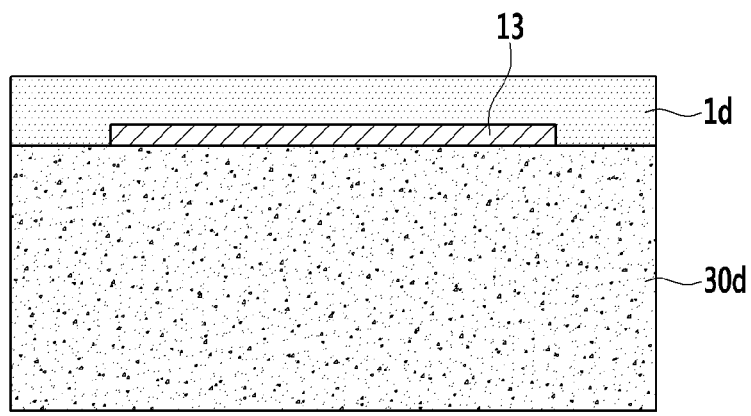

Referring to FIG. 16, a fourth body part 1d is formed to cover the fourth substrate 30d and the second capacitive electrode 13.

The fourth body part 1d is made of a flexible polymer, and the flexible polymer may include polydimethylsiloxane (PDMS), which is a material that is harmless to the human body.

Figure 17:
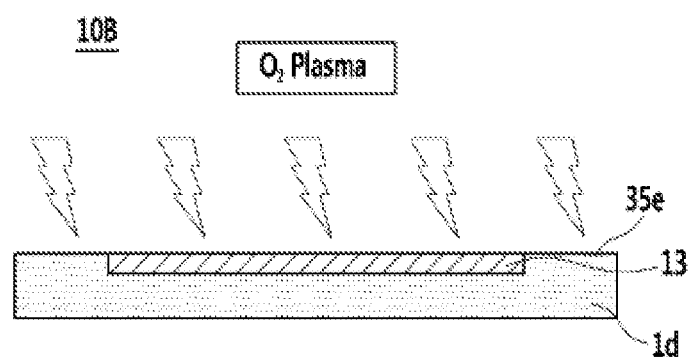

Referring to FIG. 17, the second capacitive electrode 13 and the fourth body part 1d are separated from the fourth substrate 30d to form a second capacitance electrode part 10B.

When the second capacitive electrode 13 and the fourth body part 1d are separated from the fourth substrate 30d, a peel-off scheme is used. In particular, the fourth body part 1d may be easily separated from the fourth substrate 30d that is firm since it is a flexible material.

Then, $O_2$ plasma treatment is performed on a surface on which the second capacitive electrode 13 is exposed to form a fifth bonded part 35e on the fourth body part 1d.

Figure 18:
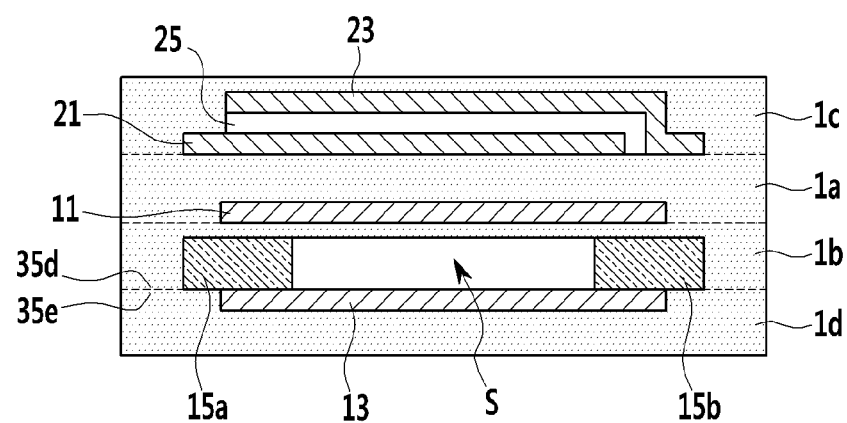

Finally, referring to FIG. 18, the fourth bonded part 35d of the second body part 1b and the fifth bonded part 35e of the fourth body part 1d are bonded to each other to complete the detachable microphone.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit

What is claimed is:
1. A detachable microphone, comprising:
a body part made of a flexible polymer;

a capacitance part positioned in the body part and including a support interposed between a first capacitive electrode and a second capacitive electrode; and a piezoelectric part positioned on the capacitance part and positioned in the body part, and including a piezoelectric body interposed between a first piezoelectric electrode and a second piezoelectric electrode, wherein the support is positioned on the second capacitive electrode, the support including a first support and a second support spaced apart from each other by a predetermined gap, and having a space part formed between the first support and the second support.

2. The detachable microphone of claim 1, wherein the piezoelectric part vibrates together with the first capacitive electrode when sound pressure is input.

3. The detachable microphone of claim 1, wherein in the capacitance part, the first capacitive electrode vibrates together with the piezoelectric part when sound pressure is input, such that a gap between the first capacitive electrode and the second capacitive electrode is changed.

4. The detachable microphone of claim 1, wherein the piezoelectric body is made of any one of polyvinyl difluoride (PVDF), lead zirconate titanate (PZT), zinc peroxide (ZnO), and barium titanate ($BaTiO_3$).

5. The detachable microphone of claim 1, wherein the support is made of SU-8.

6. The detachable microphone of claim 1, wherein the flexible polymer is made of polydimethylsiloxane (PDMS).

* * * * *